(12) United States Patent
Nakanishi et al.

(10) Patent No.: US 8,289,076 B2
(45) Date of Patent: Oct. 16, 2012

(54) AMPLIFYING CIRCUIT

(75) Inventors: Yoshinori Nakanishi, Osaka (JP); Kei Asao, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 13/226,553

(22) Filed: Sep. 7, 2011

(65) Prior Publication Data

US 2012/0098601 A1  Apr. 26, 2012

(30) Foreign Application Priority Data

Oct. 21, 2010 (JP) ................................. 2010-236032

(51) Int. Cl.
*H03F 1/14* (2006.01)
(52) U.S. Cl. ...... 330/51; 330/207 P; 330/298; 381/94.5; 381/120
(58) Field of Classification Search .................... 330/51, 330/298, 207 P; 381/94.5, 120
See application file for complete search history.

(56) References Cited

U.S. PATENT DOCUMENTS

| | | | | |
|---|---|---|---|---|
| 4,427,951 A | * | 1/1984 | Amada et al. | 330/298 |
| 4,673,888 A | * | 6/1987 | Engelmann et al. | 330/10 |
| 5,224,169 A | * | 6/1993 | Morris et al. | 381/55 |
| 6,806,766 B2 | * | 10/2004 | Hasegawa | 330/9 |
| 7,362,180 B2 | | 4/2008 | Noro et al. | |

FOREIGN PATENT DOCUMENTS

| | | |
|---|---|---|
| JP | 59-090488 | 5/1984 |
| JP | 07-014718 | 3/1995 |
| JP | 2006-060278 | 3/2006 |
| JP | 2008-294561 | 12/2008 |

* cited by examiner

*Primary Examiner* — Patricia Nguyen

(74) *Attorney, Agent, or Firm* — Renner, Otto, Boisselle & Sklar, LLP

(57) ABSTRACT

When an output voltage from the amplifying circuit includes a positive DC voltage, an electric current continuously flows in a power source voltage, a load, and a reference voltage in this order. As a result, the reference voltage increases so as to be a first threshold voltage or more. The detecting section detects that the reference voltage is the first threshold voltage or more. When the output voltage from the amplifying circuit includes a negative DC voltage, an electric current continuously flows in the reference voltage, the load, a grounding potential in this order. As a result, the reference voltage reduces so as to be a second threshold voltage or less. The detecting section detects that the reference voltage is the second threshold voltage or less.

4 Claims, 3 Drawing Sheets

AMPLIFYING CIRCUIT

BACKGROUND OF THE INVENTION

1. Field of the Invention

The present invention relates to an amplifying apparatus.

2. Description of the Related Art

Japanese Patent Application Laid-Open No. 2006-60278 discloses an amplifying apparatus provided with a detecting circuit for detecting that an output signal from an amplifying circuit includes a DC voltage unsuitable for a speaker, and outputting a detection signal. In this amplifying apparatus, since the detecting circuit detects an output signal itself output from the amplifying circuit to the speaker, the detecting circuit functions as a load for the amplifying circuit, and thus sound quality is deteriorated.

SUMMARY OF THE INVENTION

It is an object of the present invention to provide an amplifying apparatus in which a detecting section for detecting that an output signal output from an amplifying circuit to a load includes a DC voltage does not function as the load for the amplifying circuit.

An amplifying circuit that is operated by a single power supply, connectable to a voltage source and grounding potential, comprises: a reference voltage generating section for generating a reference voltage to be supplied to a negative-side input terminal of a load based on a power source voltage to be supplied from the voltage source; an amplifying circuit for amplifying an input signal and outputting the signal to a positive-side input terminal of the load, the amplifying circuit being operated by the power source voltage to be supplied from the voltage source; a threshold voltage generating section for generating a first threshold voltage normally higher than the reference voltage and a second threshold voltage normally lower than the reference voltage based on the power source voltage to be supplied from the voltage source; and a detecting section for comparing the reference voltage with the first threshold voltage and comparing the reference voltage with the second threshold voltage, outputting a signal representing that an output voltage from the amplifying circuit includes a DC voltage when the reference voltage is not less than the first threshold voltage or the reference voltage is not more than the second threshold voltage, and outputting a signal representing that the output voltage from the amplifying circuit does not include a DC voltage when the reference voltage is lower than the first threshold voltage and the reference voltage is higher than the second threshold voltage.

When an output voltage from the amplifying circuit includes a positive DC voltage, an electric current continuously flows in a power source voltage, a load, and a reference voltage in this order. As a result, the reference voltage increases so as to be a first threshold voltage or more. The detecting section detects that the reference voltage is the first threshold voltage or more, and outputs a signal representing that the output voltage from the amplifying circuit includes a DC voltage. On the other hand, when the output voltage from the amplifying circuit includes a negative DC voltage, an electric current continuously flows in the reference voltage, the load, a grounding potential in this order. As a result, the reference voltage reduces so as to be a second threshold voltage or less. The detecting section detects that the reference voltage is the second threshold voltage or less, and outputs a signal representing that the output voltage from the amplifying circuit includes a DC voltage. Thus, the detecting section does not detect an output voltage output from the amplifying circuit, but detects the reference voltage to be supplied to a negative-side input terminal of the load. For this reason, the detecting section does not become the load for the amplifying circuit, and deterioration in quality of the output voltage from the amplifying circuit can be prevented.

Preferably the amplifying circuit further comprises a prohibiting section for prohibiting flowing of an electric current between the detecting section and the threshold voltage generating section when the reference voltage is lower than the first threshold voltage and the reference voltage is higher than the second threshold voltage.

When the reference voltage is lower than the first threshold voltage and the reference voltage is higher than the second threshold voltage, namely, the output voltage from the amplifying circuit does not include a DC voltage, flowing of an electric current between the detecting section and a threshold voltage generating section is prevented. For this reason, the first threshold voltage and the second threshold voltage are maintained in predetermined values. Therefore, since the first threshold voltage and the second threshold voltage do not fluctuate, increase/decrease in the reference voltage can be accurately detected.

Preferably the reference voltage generating section includes a series circuit having a first resistor and a second resistor connected to the voltage source in parallel, the first resistor and the second resistor are set to have equal values, a voltage at a connecting point between the first resistor and the second resistor is the reference voltage, the threshold voltage generating section includes a series circuit having a third resistor, a fourth resistor and a fifth resistor connected to the voltage source in parallel, a voltage at a connecting point between the third resistor and the fourth resistor is the first threshold voltage, and a voltage at a connecting point between the fourth resistor and the fifth resistor is the second threshold voltage.

Such a constitution can establish a relationship such that normally the reference voltage is lower than the first threshold voltage and higher than the second threshold voltage.

Preferably the detecting section includes a first transistor that is put into an ON state when the reference voltage is not less than the first threshold voltage, and is put into an OFF state when the reference voltage is lower than the first threshold voltage, and a second transistor that is put into an ON state when the second threshold voltage is not less than the reference voltage, and is put into an OFF state when the second threshold voltage is lower than the reference voltage. When the first transistor is in the ON state or the second transistor is in the ON state, a signal representing that the output voltage from the amplifying circuit includes a DC voltage is output. When the first transistor is in the OFF state and the second transistor is in the OFF state, a signal representing that the output voltage from the amplifying circuit does not include a DC voltage is output.

DETAILED DESCRIPTION OF THE PREFERRED EMBODIMENTS

Figure 1:
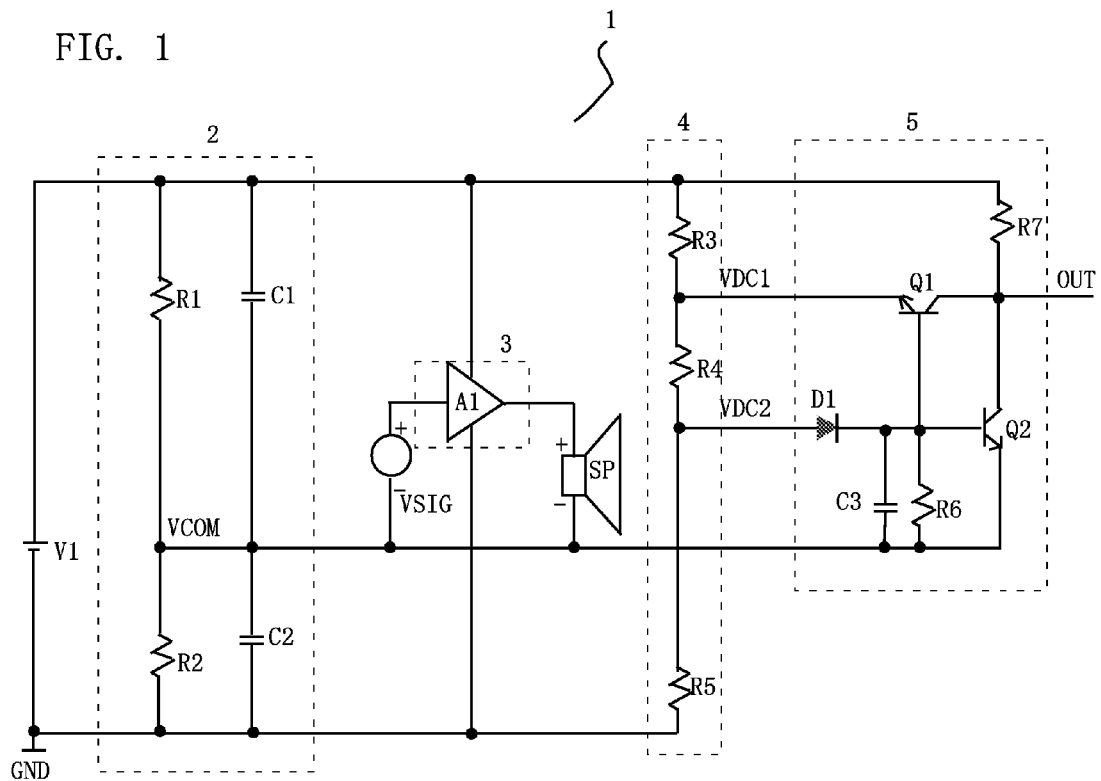
FIG. 1 is a schematic block diagram illustrating an amplifying apparatus 1 according to a preferred embodiment of the present invention.

A preferred embodiment of the present invention will be described concretely below with reference to the drawings, but the present invention is not limited to the embodiment. FIG. 1 is a schematic circuit block diagram illustrating an amplifying apparatus 1 according to the embodiment. The amplifying apparatus 1 is connected to a voltage source V1 and a grounding potential, and the amplifying apparatus 1 is operated by a single power supply (one-sided power supply). The amplifying apparatus 1 includes a reference voltage generating section 2, an amplifier section 3, a threshold voltage generating section 4, and a detecting section 5.

The reference voltage generating section 2 is a circuit for generating a reference voltage Vcom for operating the amplifying apparatus 1. The reference voltage Vcom is supplied to a negative-side input terminal of a speaker as one example of a load, and is supplied to a standard potential of a signal source VSIG.

The reference voltage generating section 2 includes resistors R1 and R2. One end of the resistor R1 is connected to a positive side of the voltage source V1, and the other end is connected to one end of the resistor R2. One end of the resistor R2 is connected to the other end of the resistor R1, and the other end is connected to a negative side of the voltage source V1 (and the grounding potential). That is, a series circuit composed of the resistors R1 and R2 is connected to the voltage source V1 in parallel. A voltage at a connecting point between the resistor R1 and the resistor R2 is a reference voltage VCOM, and is expressed by VCOM=R2·V1/(R1+R2). In this example, resistance values of the resistors R1 and R2 are set to be equal to each other, and the reference voltage VCOM is V1/2.

The reference voltage generating section 2 includes capacitors C1 and C2. One end of the capacitor C1 is connected to the positive side of the voltage source V1, and the other end is connected to one end of the capacitor C2. One end of the capacitor C2 is connected to the other end of the capacitor C1, and the other end is connected to the negative side of the voltage source V1 (and the grounding potential).

The amplifier section 3 amplifies an input alternating signal (for example, a sound signal) input from the signal source VSIG, and supplies the amplified sound signal to a positive-side input terminal of a speaker SP as the load. The amplifier section 3 has an amplifying circuit A1. The amplifying circuit A1 is connected to the power source voltage V1 and the grounding potential, and an amplification operation is performed by the power source voltage V1. As described above, the reference voltage VCOM is supplied to the standard potential of the signal source VSIG and a negative-side input terminal of the speaker SP.

The threshold voltage generating section 4 generates a first threshold voltage VDC1 that is normally higher than the reference voltage VCOM, and a second threshold voltage VDC2 that is normally lower than the reference voltage VCOM based on a power supply voltage supplied from the voltage source V1. These threshold voltages are used when the detecting section 5 detects whether the output signal of the amplifying circuit A1 includes a DC voltage.

The threshold voltage generating section 4 includes resistors R3, R4 and R5. One end of the resistor R3 is connected to the positive side of the voltage source V1, and the other end is connected to one end of the resistor R4. One end of the resistor R4 is connected to the other end of the resistor R3, and the other end is connected to one end of the resistor R5. One end of the resistor R5 is connected to the other end of the resistor R4, and the other end is connected to the negative side of the voltage source V1 (and the grounding potential). That is, the series circuit including the resistors R3, R4 and R5 is connected in the voltage source V1 in parallel.

A voltage at a connecting point between the resistors R3 and R4 is the first threshold voltage VDC1, and a voltage at a connecting point between the resistors R4 and R5 is the second threshold voltage VDC2. That is, VDC1 is V1·(R4+R5)/(R3+R4+R5), and VDC2 is V1·R5/(R3+R4+R5). In this example, since the resistors R3, R4 and R5 are set to equal values, VDC1 =2V1/3, and VDC2 is V1/3. Therefore, when the output voltage from the amplifying circuit A1 does not include a DC voltage, namely, at the time of a normal operation, the first threshold voltage VDC1 is higher than the reference voltage VCOM, and the second threshold voltage VDC2 is lower than the reference voltage VCOM.

The detecting section 5 detects whether the output voltage from the amplifying circuit A1 includes a DC voltage. That is, the detecting section 5 detects whether the output voltage from the amplifying circuit A1 includes a positive-side DC voltage and/or a negative-side DC voltage. When the detection is made that the DC voltage is included, the detecting section 5 outputs a detection signal representing that the output voltage from the amplifying circuit A1 includes a DC voltage (for example, a low-level signal). This signal is supplied to a control section, such as a microcomputer, not shown, and the control section executes a protection process such as stop of the operation of the amplifying apparatus 1.

The detecting section 5 detects whether the output voltage from the amplifying circuit A1 includes the DC voltage in such a manner that a voltage value of the reference voltage VCOM is compared with the first threshold voltage VDC1 and the second threshold voltage VDC2. When the output voltage from the amplifying circuit A1 includes a positive-side DC voltage, the reference voltage VCOM increases. When the output voltage from the amplifying circuit A1 includes a negative-side DC voltage, the reference voltage VCOM decreases. Therefore, increase/decrease in the reference voltage VCOM is determined by comparing the reference voltage VCOM with the first threshold voltage VDC1 and the second threshold voltage VDC2, so that the determination can be made whether the output voltage from the amplifying circuit A1 includes a DC voltage.

When the reference voltage VCOM is the first threshold voltage VDC1 or more, or the reference voltage VCOM is the second threshold voltage VDC2 or less, the detecting section 5 outputs a signal representing that the output voltage from the amplifying circuit A1 includes a DC voltage. When the reference voltage VCOM is lower than the first threshold voltage VDC1, and the reference voltage VCOM is higher than the second threshold voltage VDC2, a signal representing that the output voltage from the amplifying circuit A1 does not include a DC voltage is output.

The detecting section 5 includes transistors (for example, npn bipolar transistors) Q1 and Q2, resistors R6 and R7, and a diode D1. A base of the transistor Q2 is connected to a cathode of the diode D1, and the reference voltage VCOM is supplied to its emitter. A collector of the transistor Q2 is connected to a collector of the transistor Q1, one end of the resistor R7 and an output terminal OUT of the detecting section 5. The second threshold voltage VDC2 is supplied to an anode of the diode D1. A base of the transistor Q1 is connected to the cathode of the diode D1, one end of the resistor R6 and the base of the transistor Q2, and the first threshold voltage VDC1 is supplied to its emitter. The collector of the transistor Q1 is connected to the collector of the transistor Q2, one end of the resistor R7 and the output terminal OUT of the detecting section 5. The other end of the resistor R7 is connected to the positive side of the voltage source V1. The reference voltage VCOM is supplied to the other end of the resistor R6. One end of a capacitor C3 is connected to the cathode of the diode D1, the base of the transistor Q1 and the base of the transistor Q2. The reference voltage VCOM is supplied to the other end of capacitor C3.

The transistor Q1 detects whether the reference voltage VCOM is the first threshold voltage VDC1 or more so as to detect whether the output voltage from the amplifying circuit A1 includes a positive-side DC voltage. More specifically, the first threshold voltage VDC1 is a voltage value obtained by adding a conduction start voltage 0.6 V of the transistor Q1 to the voltage at the connecting point between the resistors R3 and R4. The transistor Q2 detects whether the second threshold voltage VDC2 is the reference voltage VCOM or more so as to detect whether the output voltage from the amplifying circuit A1 includes a negative-side DC voltage.

The detecting section 5 includes a prohibiting section. The prohibiting section prohibits flowing of an electric current between the detecting section 5 and the threshold voltage generating section 4 when the reference voltage VCOM is lower than the first threshold voltage VDC1 and the reference voltage VCOM is higher than the second threshold voltage VDC2. The prohibiting section includes, for example, the diode D1, and a diode formed between the base and the emitter of the transistor Q1. A diode (its anode is connected to the emitter of the transistor Q1) may be further provided between the connecting point between the resistors R3 and R4, and the emitter of the transistor Q1.

An operation of the amplifying apparatus 1 having the above constitution will be described.

[Case where Output Voltage from the Amplifying Circuit A1 does not Include DC Voltage (Normal State)]

Figure 2:
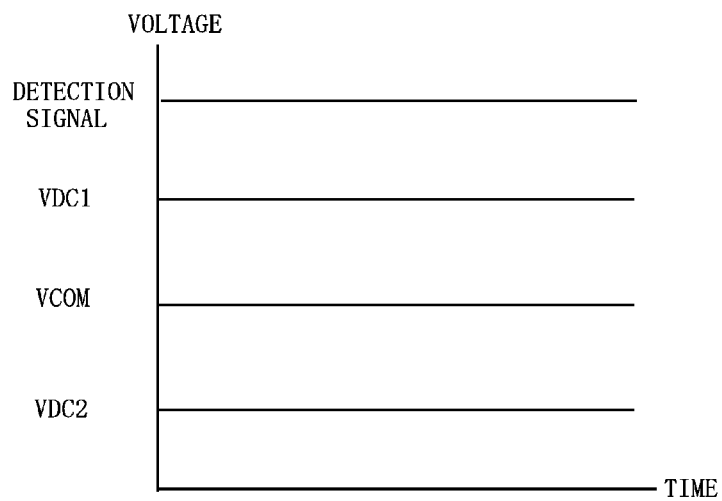
FIG. 2 is a diagram illustrating a voltage waveform of the amplifying apparatus 1.

Since the output voltage from the amplifying circuit A1 does not include a DC voltage, as shown in FIG. 2, the reference voltage VCOM does not increase nor decrease, is lower than the first threshold voltage VDC1 and higher than the second threshold voltage VDC2. That is, the reference voltage VCOM maintains a state that $R2 \cdot V1/(R1+R2)=V1/2$.

Therefore, since the reference voltage VCOM to be supplied to the base of the transistor Q1 is lower than the first threshold voltage VDC1 to be supplied to the emitter, the transistor Q1 is in an OFF state. That is, the transistor Q1 detects that the output voltage from the amplifying circuit A1 does not include a positive-side DC voltage.

Since the second threshold voltage VDC2 to be supplied to the base of the transistor Q2 is lower than the reference voltage VCOM to be supplied to the emitter, the transistor Q2 is in an OFF state. That is, the transistor Q2 detects that the output voltage from the amplifying circuit A1 does not include a negative-side DC voltage.

Since the transistors Q1 and Q2 are in the OFF state, the power source voltage V1 that is determined as a high-level signal in the microcomputer is output from the output terminal OUT of the detecting section 5. That is, a detection signal representing that the output voltage from the amplifying circuit A1 does not include a DC voltage is output.

[Case where Output Voltage from the Amplifying Circuit A1 Includes Positive-side DC Voltage]

Figure 3:
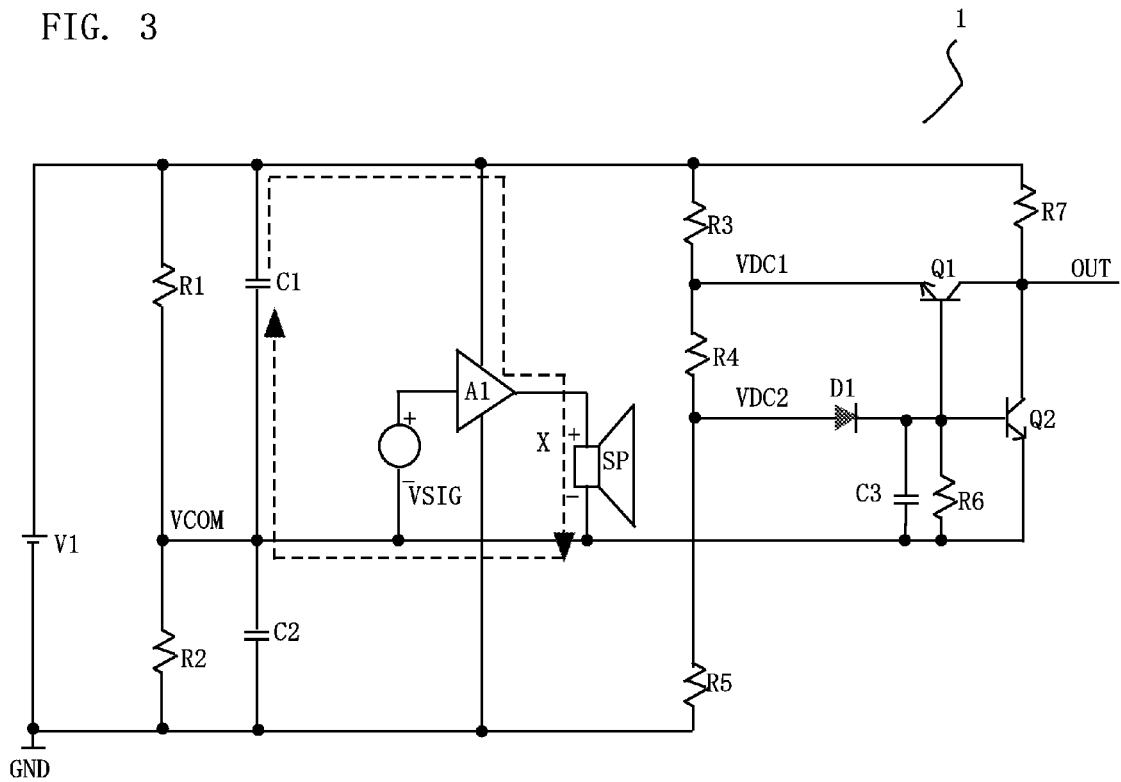
FIG. 3 is a diagram illustrating an operation of the amplifying apparatus 1.
Figure 4:
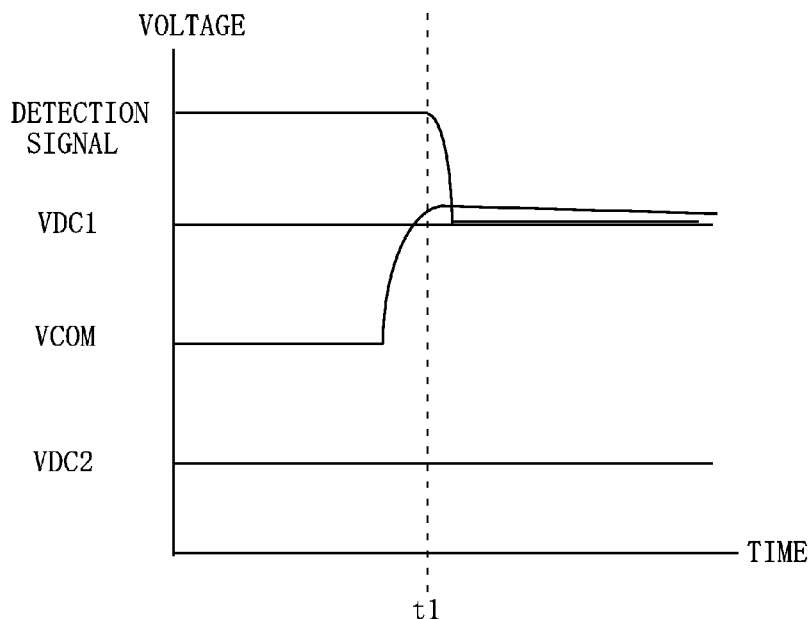
FIG. 4 is a diagram illustrating a voltage waveform of the amplifying apparatus 1.

When the output voltage from the amplifying circuit A1 includes a positive-side DC voltage, as shown in FIG. 3, an electric current continuously flows in a path shown by an arrow X. That is, the electric current continuously flows in the path including the positive-side input terminal of the speaker, the negative-side input terminal of the speaker, a voltage line of VCOM, the capacitor C1, a voltage line of the power source voltage V1, the amplifying circuit A1, and the positive-side input terminal of the speaker. Therefore, this case is equivalent to the circuit configuration where the resistors are connected in parallel with respect to the resistor R1, and the reference voltage VCOM increases from $R2 \cdot V1/(R1+R2)=V1/2$. That is, as shown in FIG. 4, the reference voltage VCOM becomes the first threshold voltage VDC1 or more at time t1.

Therefore, since the reference voltage VCOM to be supplied to the base of the transistor Q1 is not less than the first threshold voltage VDC1 to be supplied to the emitter, the transistor Q1 is put into the ON state. That is, the transistor Q1 detects that the output voltage from the amplifying circuit A1 includes a positive-side DC voltage. Since the transistor Q1 is in the ON state, the first threshold voltage VDC1 determined as a low-level signal in the microcomputer is output from the output terminal OUT of the detecting section 5. That is, a detection signal representing that the output voltage from the amplifying circuit A1 includes a DC voltage is output. In response to this, the microcomputer executes the protection process such as stop of the operation of the amplifying apparatus 1.

Since the second threshold voltage VDC2 to be supplied to the base of the transistor Q2 is lower than the reference voltage VCOM to be supplied to the emitter, the transistor Q2 is in the OFF state. That is, the transistor Q2 detects that the output voltage from the amplifying circuit A1 does not include a negative-side DC voltage.

[Case where Output Voltage from the Amplifying Circuit A1 Includes Negative-side DC Voltage]

Figure 5:
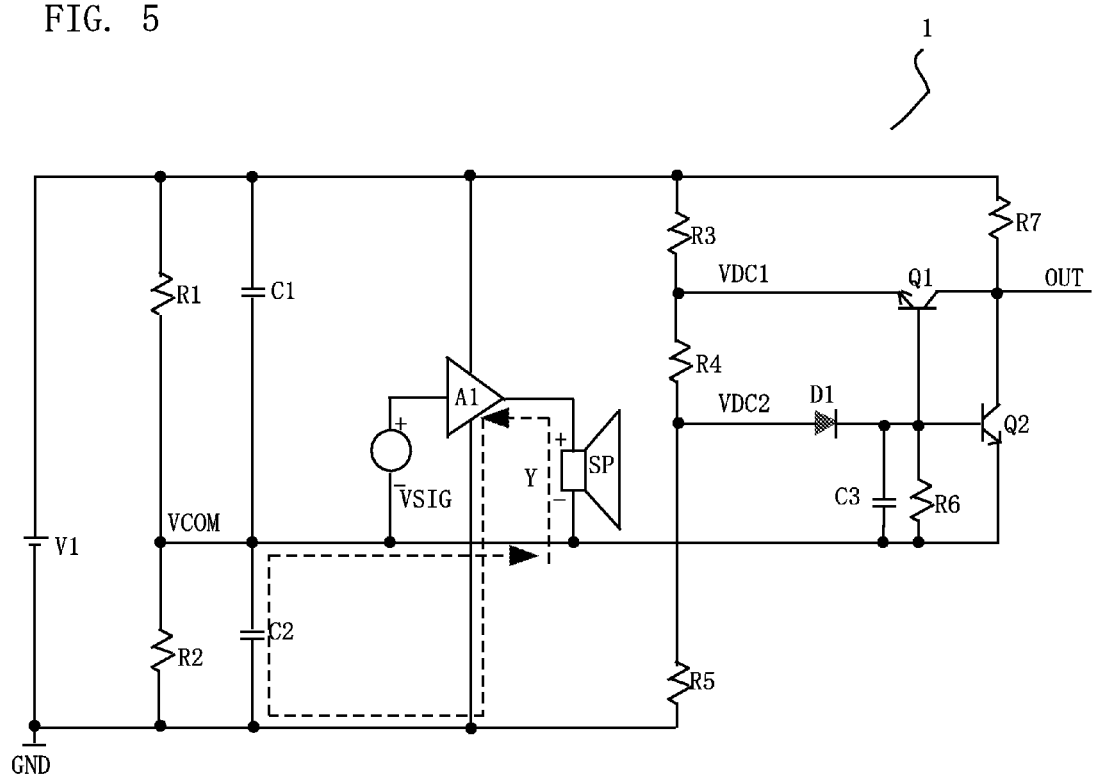
FIG. 5 is a diagram illustrating an operation of the amplifying apparatus 1.
Figure 6:
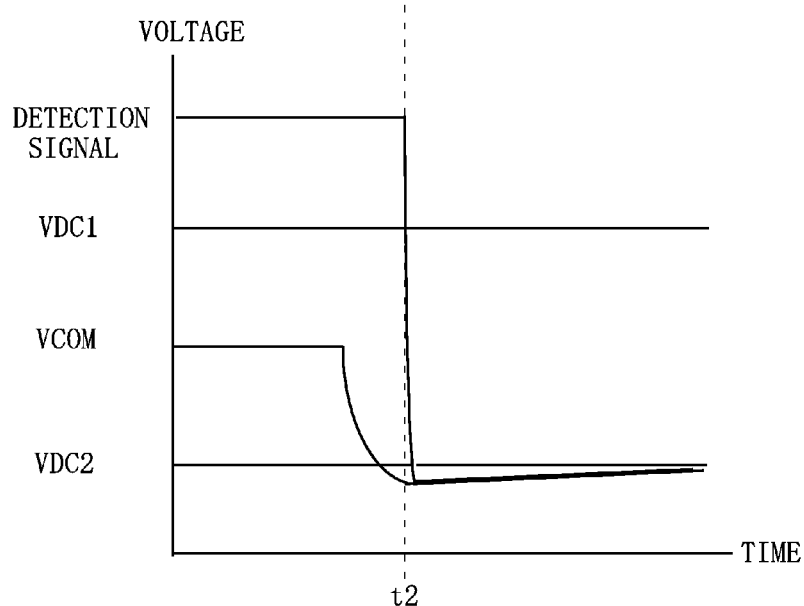
FIG. 6 is a diagram illustrating a voltage waveform of the amplifying apparatus 1.

When the output voltage from the amplifying circuit A1 includes a negative-side DC voltage, as shown in FIG. 5, an electric current continuously flows in the path shown by an arrow Y. That is, the electric current continuously flows in the path including a standard potential Vcom, the negative-side input terminal of the speaker, the positive-side input terminal of the speaker, the amplifying circuit A1, a line of the grounding potential, the capacitor C2, the voltage line of VCOM, and the negative-side input terminal of the speaker. Therefore, this case is equivalent to the circuit configuration where the resistors are connected in parallel with respect to the resistor R2, and the reference voltage VCOM reduces from $R2 \cdot V1/(R1+R2)=V1/2$. That is, as shown in FIG. 6, the reference voltage VCOM is less than the second threshold voltage VDC2 at time t2.

Therefore, since the second threshold voltage VDC2 to be supplied to the base of the transistor Q2 is the reference voltage VCOM to be supplied to the emitter or more, the transistor Q2 is put into the ON state. That is, the transistor Q2 detects that the output voltage from the amplifying circuit A1 includes a negative-side DC voltage. Since the transistor Q2 is in the ON state, the reference voltage VCOM determined as a low-level signal in the microcomputer is output from the output terminal OUT of the detecting section 5. That is, a detection signal representing that the output voltage from the amplifying circuit A1 includes a DC voltage is output. In response to this, the microcomputer executes the protection process such as stop of the operation of the amplifying apparatus 1.

Since the reference voltage VCOM to be supplied to the base of the transistor Q1 is lower than the first threshold voltage VDC1 to be supplied to the emitter, the transistor Q1 is in the OFF state. That is, the transistor Q1 detects that the output voltage from the amplifying circuit A1 does not include a positive-side DC voltage.

An effect of the amplifying apparatus 1 will be described below.

The detecting section 5 is not connected to the output terminal of the amplifying circuit A1 (namely, the positive-side input terminal of the speaker) but is connected to the voltage line of the reference voltage VCOM (namely, the negative-side input terminal of the speaker). Therefore, since the detecting section 5 does not function as the load of the amplifying circuit A1, deterioration in the sound quality of an output sound signal output from the amplifying circuit A1 is prevented.

Further, the detecting section 5 is not connected to the output terminal of the amplifying circuit A1 but is connected to the voltage line of the reference voltage VCOM. Even when the detecting section 5 is shared by amplifiers with a plurality of channels (for example, an amplifier for a left channel sound signal and an amplifier for a right channel sound signal), an electric current of the sound signal output from an amplifier circuit of one channel is reversed to an amplifier circuit of another channel, and thus no noise is generated.

Since the diode D1 is provided, when the output voltage from the amplifying circuit A1 does not include a DC voltage, and the reference voltage VCOM is higher than the second threshold voltage VDC2, an electric current is prevented from flowing from the voltage line of the reference voltage VCOM via the resistor R6 and the diode D1 to the threshold voltage generating section 4 (the connecting point between the resistors R4 and R5). Similarly, the diode to be formed between the base and the emitter of the transistor Q2 prevents the electric current from flowing from the connecting point between the resistors R3 and R4 of the threshold voltage generating section 4 via the transistor Q1 and the resistor R6 to the voltage line of the reference voltage VCOM when the output voltage from the amplifying circuit A1 does not include a DC voltage and the reference voltage VCOM is lower than the first threshold voltage VDC1.

Therefore, when the output voltage from the amplifying circuit A1 does not include a DC voltage, the threshold voltage generating section 4 is separated from the detecting section 5 in view of an electric current. As a result, the first threshold voltage VDC1 and the second threshold voltage VDC2 are maintained at predetermined voltage values. As a result, when the output voltage from the amplifying circuit A1 includes a DC voltage, and the reference voltage VCOM increases or decreases, the increase/decrease in the reference voltage VCOM can be securely detected.

When the output voltage from the amplifying circuit A1 does not include a DC voltage, the threshold voltage generating section 4 is separated from the detecting section 5 in view of an electric current, so that the influence of the detecting section 5 can prevent the deterioration in the sound quality of the output signal from the amplifying circuit A1.

The preferred embodiment of the present invention has been described, but the present invention is not limited to the embodiment. Polarity of the transistors of the detecting section 5 is suitably changed according to a case where the detection signal output from the output terminal OUT is a signal including a DC voltage at a high level or a case where the detection signal is a signal including a DC voltage at a low level.

What is claimed is:

1. An amplifying circuit that is operated by a single power supply, connectable to a voltage source and grounding potential, comprising:

a reference voltage generating section for generating a reference voltage to be supplied to a negative-side input terminal of a load based on a power source voltage to be supplied from the voltage source;

an amplifying circuit for amplifying an input signal and outputting the signal to a positive-side input terminal of the load, the amplifying circuit being operated by the power source voltage to be supplied from the voltage source;

a threshold voltage generating section for generating a first threshold voltage normally higher than the reference voltage and a second threshold voltage normally lower than the reference voltage based on the power source voltage to be supplied from the voltage source; and a detecting section for comparing the reference voltage with the first threshold voltage and comparing the reference voltage with the second threshold voltage, outputting a signal representing that an output voltage from the amplifying circuit includes a DC voltage when the reference voltage is not less than the first threshold voltage or the reference voltage is not more than the second threshold voltage, and outputting a signal representing that the output voltage from the amplifying circuit does not include a DC voltage when the reference voltage is lower than the first threshold voltage and the reference voltage is higher than the second threshold voltage.

2. The amplifying circuit according to claim 1, further comprising a prohibiting section for prohibiting flowing of an electric current between the detecting section and the threshold voltage generating section when the reference voltage is lower than the first threshold voltage and the reference voltage is higher than the second threshold voltage.

3. The amplifying circuit according to claim 1, wherein
the reference voltage generating section includes a series circuit having a first resistor and a second resistor connected to the voltage source in parallel, the first resistor and the second resistor are set to have equal values, a voltage at a connecting point between the first resistor and the second resistor is the reference voltage,
the threshold voltage generating section includes a series circuit having a third resistor, a fourth resistor and a fifth resistor connected to the voltage source in parallel, a voltage at a connecting point between the third resistor and the fourth resistor is the first threshold voltage, and a voltage at a connecting point between the fourth resistor and the fifth resistor is the second threshold voltage.

4. The amplifying circuit according to claim 1, wherein the detecting section includes:
a first transistor that is put into an ON state when the reference voltage is not less than the first threshold voltage, and is put into an OFF state when the reference voltage is lower than the first threshold voltage, and
a second transistor that is put into an ON state when the second threshold voltage is not less than the reference voltage, and is put into an OFF state when the second threshold voltage is lower than the reference voltage,
when the first transistor is in the ON state or the second transistor is in the ON state, a signal representing that the output voltage from the amplifying circuit includes a DC voltage is output,
when the first transistor is in the OFF state and the second transistor is in the OFF state, a signal representing that the output voltage from the amplifying circuit does not include a DC voltage is output.

* * * * *